(12) United States Patent
Lin et al.

(10) Patent No.: US 7,075,154 B2
(45) Date of Patent: Jul. 11, 2006

(54) ELECTROSTATIC DISCHARGE PROTECTION DEVICE

(75) Inventors: Shi-Tron Lin, Taipei (TW); Wei-Fan Chen, Taichung (TW)

(73) Assignee: Winbond Electronics Corp., Hsinchu (TW)

( * ) Notice: Subject to any disclaimer, the term of this patent is extended or adjusted under 35 U.S.C. 154(b) by 79 days.

(21) Appl. No.: 10/395,328

(22) Filed: Mar. 24, 2003

(65) Prior Publication Data
US 2003/0184933 A1    Oct. 2, 2003

(30) Foreign Application Priority Data
Mar. 28, 2002    (TW)    ................ 91106186 A (51) Int. Cl.
*H01L 23/62*    (2006.01)
(52) U.S. Cl. ..................................... 257/355
(58) Field of Classification Search ................ 257/355, 257/356, 357, 358, 359, 363, 364, 365, 360, 257/361, 362; 326/82, 93, 96
See application file for complete search history.

(56) References Cited

U.S. PATENT DOCUMENTS 5,874,763 A * 2/1999 Ham .......................... 257/360
2002/0145163 A1 * 10/2002 Pan ............................. 257/355

* cited by examiner

*Primary Examiner*—B. William Baumeister
*Assistant Examiner*—Dana Farahani
(74) *Attorney, Agent, or Firm*—Birch, Stewart, Kolasch & Bitch, LLP (57) ABSTRACT

An electrostatic discharge protection device formed on a substrate. The electrostatic discharge protection device includes a first isolation region formed over the substrate, an active region formed over the substrate and enclosed by the first isolation region, a second isolation region formed on the substrate and substantially surrounded by the active region, a first gate element formed in the active region, the first gate element having a first end extending over the first isolation region and a second end extending over the second isolation region, a drain region formed in the active region at a first side of the first gate element, a source region formed in the active region at a second side of the first gate element, a drain contact for electrically coupling the drain region to a first node, and a source contact for electrically coupling the source region to a second node.

48 Claims, 12 Drawing Sheets

ELECTROSTATIC DISCHARGE PROTECTION DEVICE

Pursuant to 35 U.S.C. § 119(a)–(d), this application claims priority from Taiwanese application no. 091106186, filed on Mar. 28, 2002.

BACKGROUND OF THE INVENTION

1. Field of the Invention

The present invention relates to an electrostatic discharge (ESD) protection device and particularly to an ESD protection device with improved performance.

2. Description of the Prior Art

An NMOSFET is a very effective ESD protection device. In one application, with the gate connected to a gate-driving signal, the NMOSFET is used as the pull down device of a CMOS buffer to drive an output voltage. In a second application, with the gate electrically connected to the ground, the NMOSFET is used to protect an input pin or power bus during an ESD event.

In a PS mode ESD event, with a positive ESD transient voltage applied to an IC pin while a VSS power pin is at ground potential, the protection of an NMOSFET heavily depends on the snap-back mechanism for conducting large ESD current between the drain and source. At the beginning, the high electric field at the drain junction causes impact ionization, which generates both minority and majority carriers. The minority carriers flow toward the drain contact and the majority carriers flow toward the substrate/p-well contact, causing a local potential buildup in the current path in p-well. When the local substrate potential is 0.6V higher than the adjacent n+ source potential, the source junction becomes forward biased. The forward biased source junction injects minority carriers (electrons) into the p-well, and those carriers eventually reach the drain junction to further enhance the impact ionization. As a continuous loop, the MOSFET gets into a low impedance (snapback) state to conduct large ESD current.

Figure 1A:
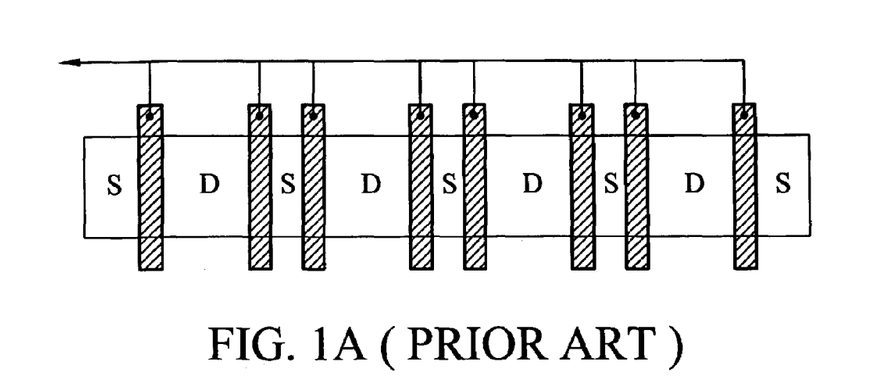
FIGS. 1A and 1B are diagrams showing a conventional ESD protection device with multiple gate fingers.
Figure 1B:
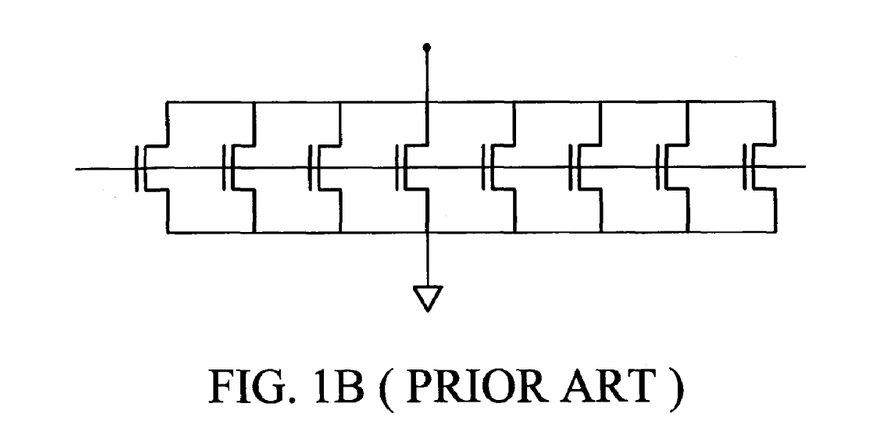

In a multi-finger NMOS structure as shown in FIGS. 1A and 1B, not all gate fingers may turn on during an ESD event. This is because the first few gate finger having turned on quickly get into a snap-back low-impedance condition. The drain terminal to source terminal voltage is reduced to a transient voltage lower than the trigger voltage of the NMOS device. This potentially prevents other gate fingers from turning on. Therefore, with only a partial number of gate fingers turned on to absorb the ESD energy, the size of the NMOSFET is effectively reduced and the ESD protection degrades.

When a gate finger is triggered in an ESD event, the entire finger turns on. This is due to a cascading effect in which a local source junction in a forward biasing state injects numerous carriers into the substrate to flow toward the drain junction, which in turn generates more minority carriers (due to impact ionization) back toward the p+ guard ring to raise the adjacent p-well potential. Thus, the gate finger turns on into a snap back condition.

Figure 2:
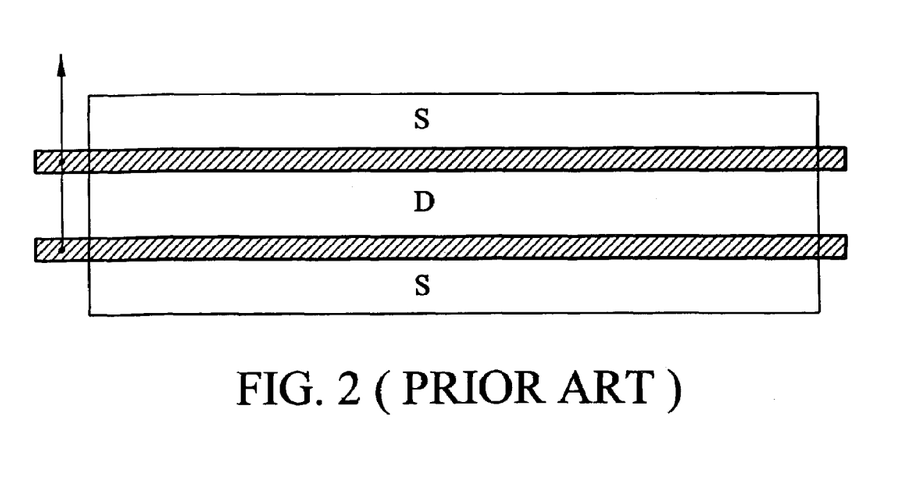
FIG. 2 is a diagram showing a long-gate-finger NMOS structure.

Experimental data has shown that long-gate-finger NMOS structure (e.g, 100 um×2 fingers) as shown in FIG. 2 has better PS-mode ESD protection than a short-gate-finger structure (e.g, 20 um×10 fingers) as shown in FIG. 1A, despite both structures having the same total gate width of 200 um. This is because, during a PS-mode ESD event, the many short-finger NMOSFET may have only a few fingers turned on while each finger is only 10% of the total gate width.

Figure 3A:
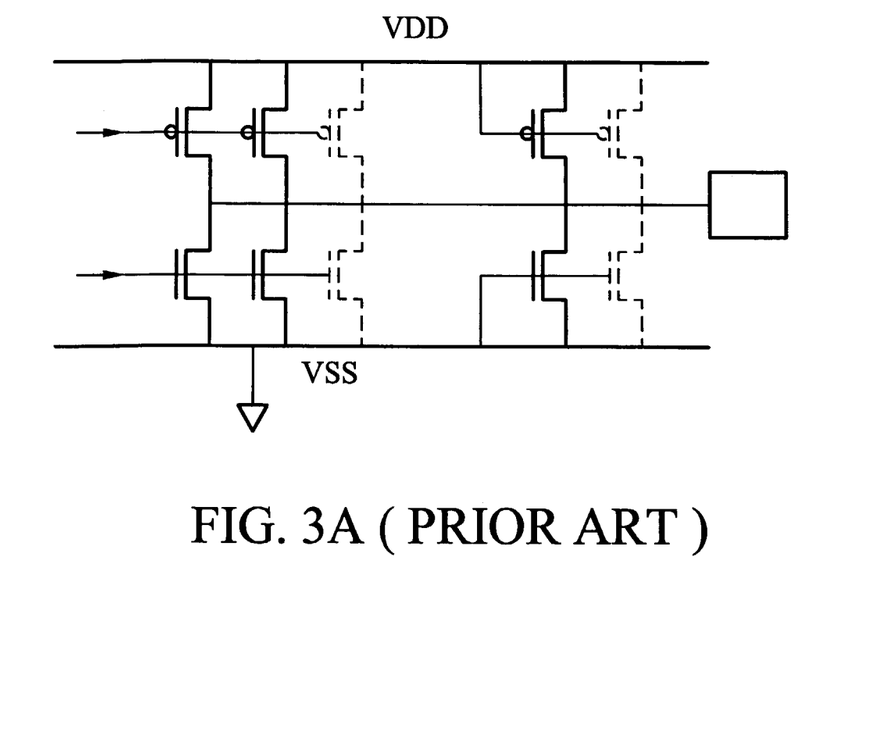
FIGS. 3A and 3B are diagrams showing a conventional MOSFET-based I/O structure with self-ESD protection.
Figure 3B:
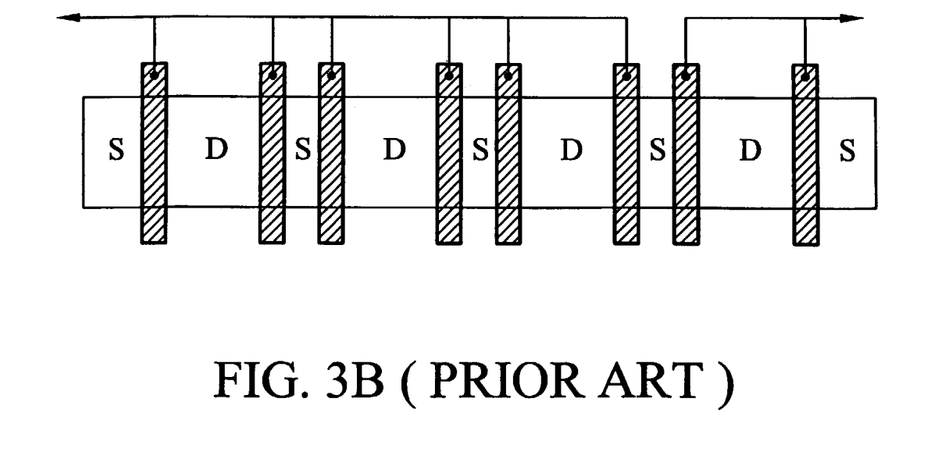

Prior art MOSFET-based I/O (Input/Output) structures with self-ESD protection typically include a number of NMOSFET and PMOSFET transistors. As shown in FIGS. 3A, 3B and 3C, the pull-down NMOSFET may comprise a number of gate elements, with some connected to a first gate signal for the output transistor portion, and some connected to the VSS bus/Ground as the input protection ESD structure. Similarly, the pull-up PMOSFET may comprise a number of gate elements, with some connected to a second gate signal for the output transistor portion, and some connected to the VDD bus as the input protection ESD structure. In the prior-art methods, a gate element formed of a poly-silicon element is typically coupled to either a gate signal or a power bus.

SUMMARY OF THE INVENTION

The objective of the present invention is to provide an ESD protection device having effective long gate fingers enabling the previously described cascading effect by which the drawbacks in the prior art are eliminated.

The present invention provides an electrostatic discharge protection device formed on a substrate. The device comprises a first isolation region formed over the substrate, an active region formed over the substrate and enclosed by the first isolation region, a second isolation region formed on the substrate and substantially surrounded by the active region, a first gate element formed in the active region, the first gate element having a first end extending over the first isolation region and a second end extending over the second isolation region, a drain region formed in the active region at a first side of the first gate element, a source region formed in the active region at a second side of the first gate element, a drain contact for electrically coupling the drain region to a first node, and a source contact for electrically coupling the source region to a second node.

The present invention further provides an electrostatic discharge protection device formed on a substrate. The device comprises a first isolation region formed over the substrate, an active region formed over the substrate and enclosed by the first isolation region, a second isolation region formed on the substrate and substantially surrounded by the active region, a first gate element formed in the active region having first and second ends, each extending over the first and second isolation regions, a second gate element formed in the active region having third and fourth ends, each extending over the first and second isolation regions, and a third gate element formed in the active region having fifth and sixth ends, each extending over the first isolation region, wherein the first and second gate elements are substantially collinear.

The present invention also provides a semiconductor device formed on a substrate. The device comprises first and second isolation regions formed over the substrate, and a first conductive element formed over the substrate, wherein the first conductive element has a first end overlapping the first isolation region and a second end overlapping the second isolation region.

Thus, in the present invention, an isolation region is formed in the active region, and collinear gates separated by the isolation region are also formed in the active region. This achieves an equivalent long gate finger enabling the cascading effect whereby the drawbacks in the conventional ESD protection device are eliminated.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 4A:
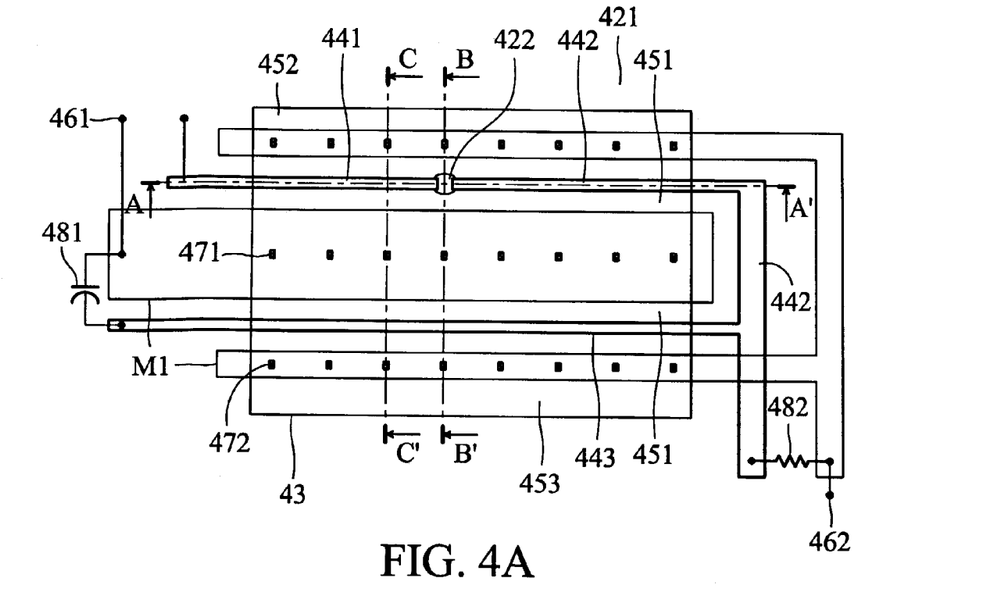
FIGS. 4A, 4B, 4C and 4D are diagrams showing an ESD protection device according to a first embodiment of the invention.
Figure 4B:
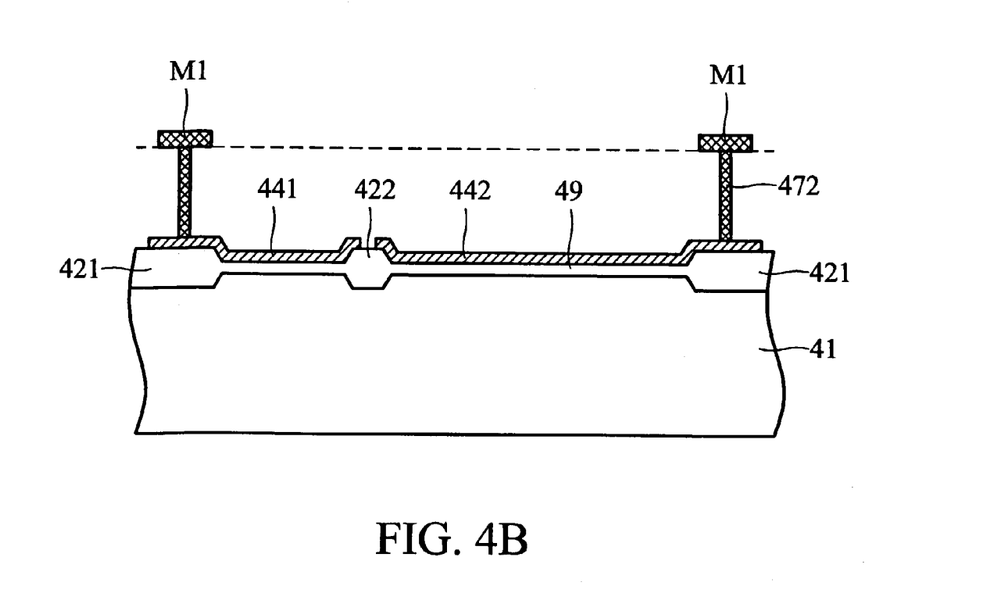
Figure 4C:
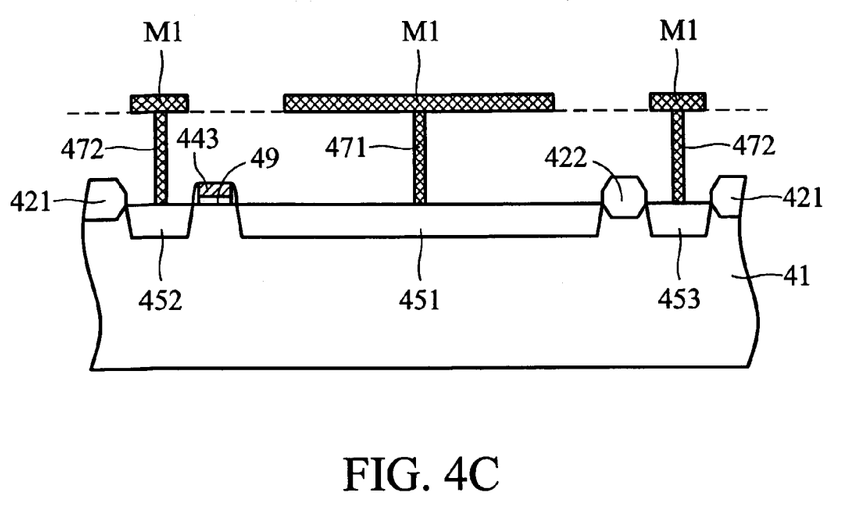
Figure 4D:
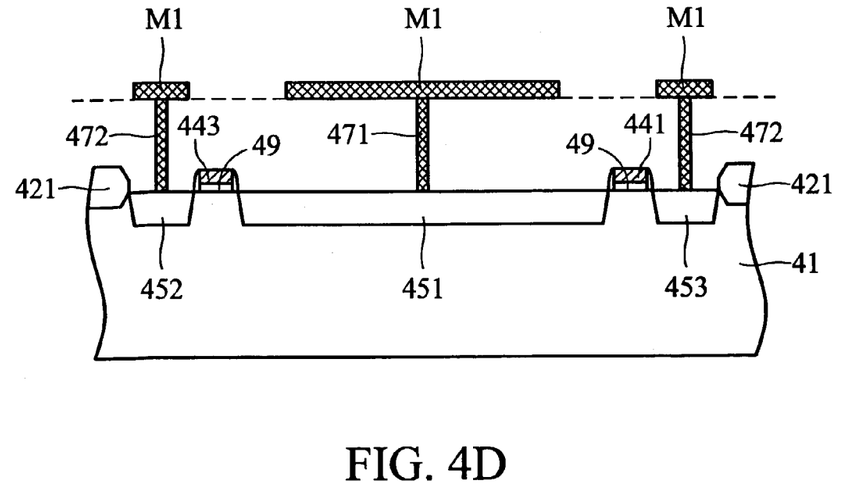

FIGS. 4A, 4B, 4C and 4D are diagrams showing an ESD protection device according to a first embodiment of the invention. FIGS. 4B, 4C and 4D show cross sections of FIG. 4A along line AA', BB' and CC' respectively. The electrostatic discharge protection device is formed on a substrate 41 and comprises an isolation region 421 formed over the substrate 41, an active region 43 formed over the substrate 41 and enclosed by the isolation region 421, another isolation region 422 formed on the substrate 41 and substantially surrounded by the active region 43, gates (conductive layer) 441, 442 and 443 formed in the active region 43, a drain region 451 formed in the active region 43 at one side of the gate 441, a source region 452 formed in the active region 43 at the other side of the gate 441, drain contacts 471 for electrically coupling the drain region 451 to a node 461, source contacts 472 for electrically coupling the source region 452 to a node 462. The gate 441 has one end extending over (overlapping)the isolation region 421 and the other end extending over (overlapping)the isolation region 422. The gate 442 has one end extending over (overlapping) the isolation region 421 and the other end extending over (overlapping)the isolation region 422. The gate 443 has two ends both extending over (overlapping)the isolation region 421. The gate 443 is electrically coupled to the gate 442. The drain contacts 471 are disposed between the gates 441 and 443, or the gates 442 and 443. The drain contacts 471 comprise at least one row of contacts parallel to the gate 441, 442 or 443. The contacts 471 and 472 may be Al contacts or Tungsten plug. The gate 441 is coupled to receive a gate-input signal and the gate 442 may be coupled to the node 462 directly or through an impedance 481. The impedance 481 may be a resistive element. The gates 442 and 443 may be also coupled to the node 461 directly or through an impedance 482. The impedance 482 may be a capacitive element. The gates 441 and 442 are substantially collinear and form an equivalent long gate finger sharing the drain region 451 and the source region 452. The transistors formed thereby are fully triggered into snap back due to the cascading effect occurring along the edges of the source-to-gate and drain-to-gate depletion regions. Each of the gates 441~443 is formed by a poly-silicon layer over an gate oxide layer 49. The gate 443 separates the drain region 451 and another source region 453 within the active region 43.

In the first embodiment, the isolation region 422 is completely surrounded by the active region 43 and separated from the isolation region 421. The node 461 may be an IC pad and the node 462 may be a power bus. The substrate 41 is a p-type silicon substrate or n-well. The node 462 is a VSS power bus if the source region 452 and 453, and the drain region 451 are n-type heavily doped regions. The node 462 is a VDD power bus if the source region 452 and 453, and the drain region 451 are p-type heavily doped region. The isolation region 422 may be field oxide or any other materials used in IC for isolation and formed by the same process as the isolation region 421. According to the prior art, the field oxide may be formed by STI or LOCOS process. Alternatively, depending on the driving strength requirement of the output transistor, gates 442 and 443 can be coupled to a gate-input signal to form a larger output transistor while the gate 441 can be coupled to a power bus to form a smaller input ESD protection device. The total gate width of the gates 441~443 should meet a minimum requirement to pass an ESD spec. As an example, the total gate width which is the total accumulated length of the poly-silicon fingers forming the input and output NMOS transistors is at least 200 μm to pass 2 KV Human-Body-Model ESD.

Figure 5A:
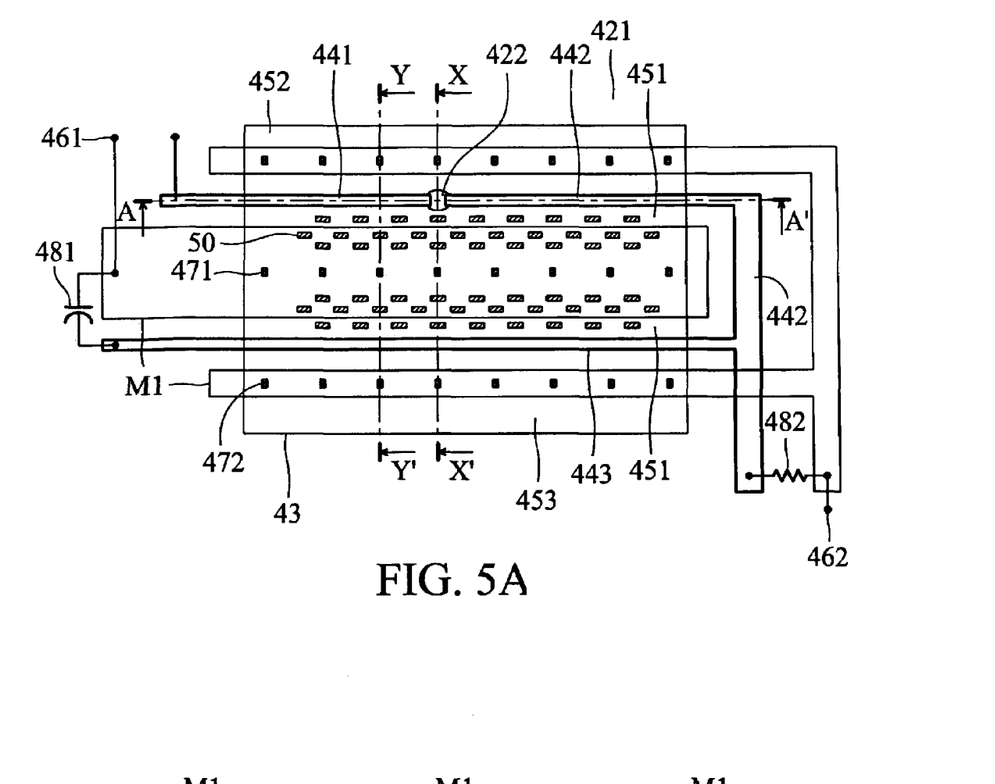
FIGS. 5A, 5B and 5C are diagrams showing an ESD protection device according to a second embodiment of the invention.
Figure 5B:
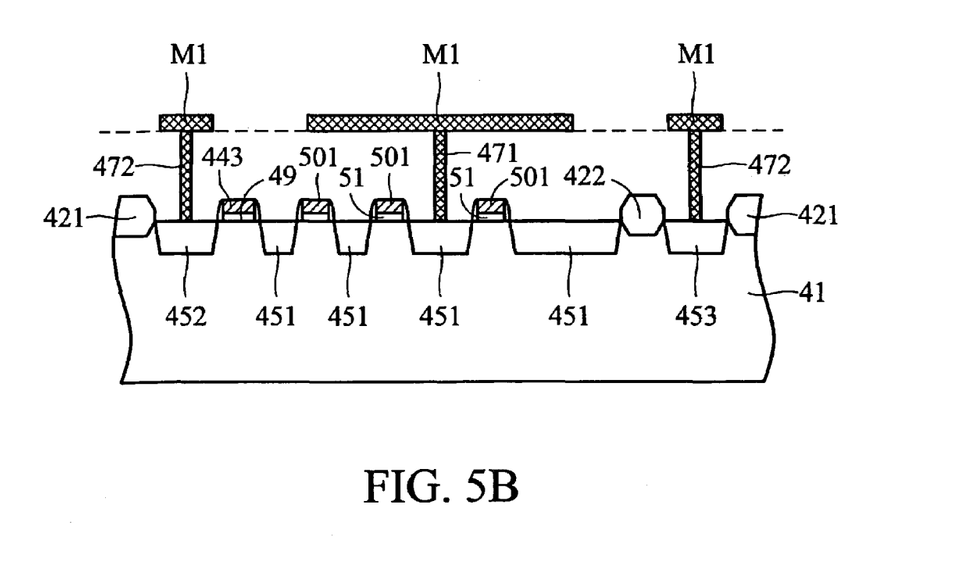
Figure 5C:
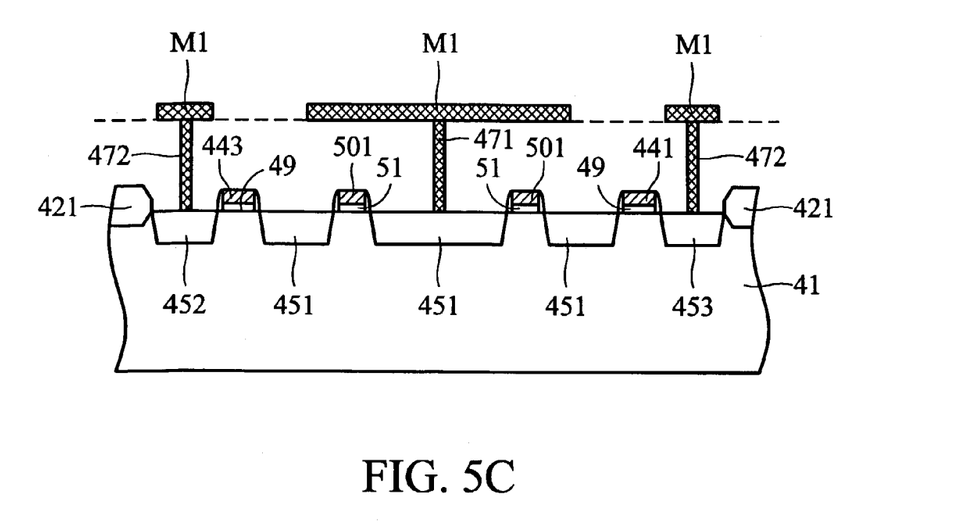
Figure 5D:
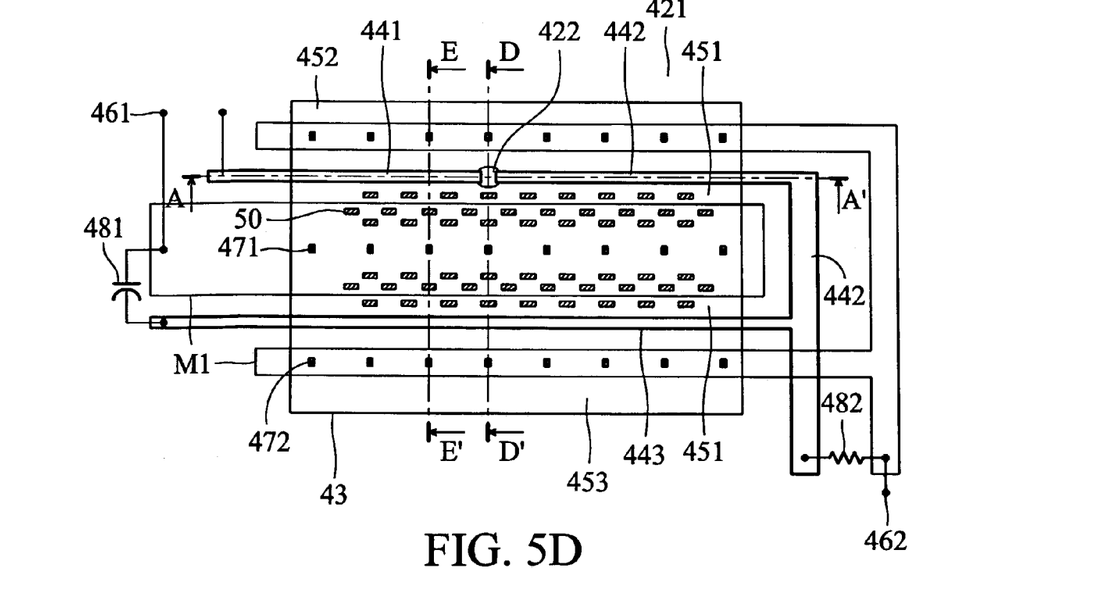

FIGS. 5A, 5B and 5C are diagrams showing an ESD protection device according to a second embodiment of the invention. FIGS. 5B and 5C show cross sections of FIG. 5A along line XX' and YY' respectively. The ESD protection devices shown in FIGS. 4A~4D and 5A~5C are similar except that there are islands 50 distributed in and surrounded by the drain region 451 in FIGS. 5A~5C. For clarity, no reiteration is made to the same elements in FIGS. 4A~4D and FIGS. 5A~5C. The formation of the islands 50 is disclosed in U.S. Pat. No. 5,721,439.

The islands 50 are arranged in an array comprising at least one island 50 or multiple rows of the islands 50 which are distributed in the drain region 451 between the drain contacts 471, and the gates 441~443 or the isolation region 422. The islands 50 may be poly-silicon elements 501 over an oxide layer. 51 simultaneously formed by the same process as the gate 441. The drain contacts 471 also form an array. The gates 441 and 442, and isolation region 422 form a first group. The island array comprises a row of islands 50 disposed between the array of drain contacts 471 and the first group. The islands 50 further enhance the consistency and uniform turn on of the ESD protection device.

Figure 6A:
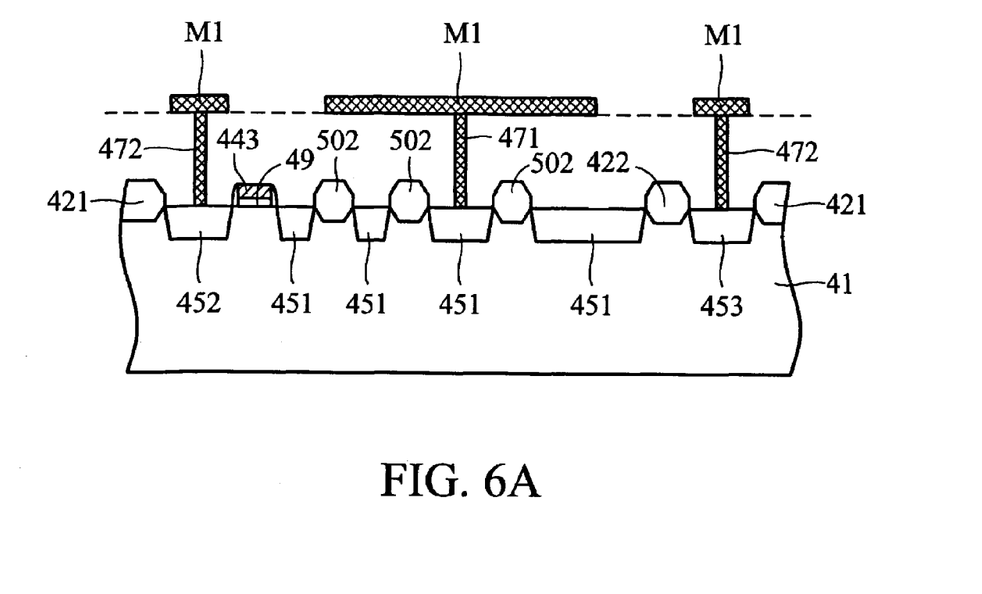
FIGS. 6A, 6B and 6C are diagrams showing an ESD protection device according to a third embodiment of the invention.
Figure 6B:
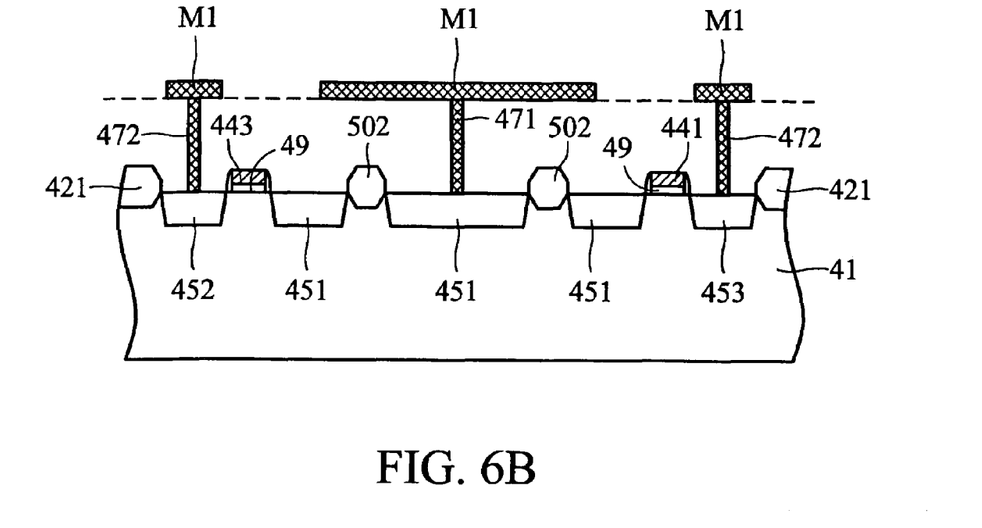
Figure 6C:
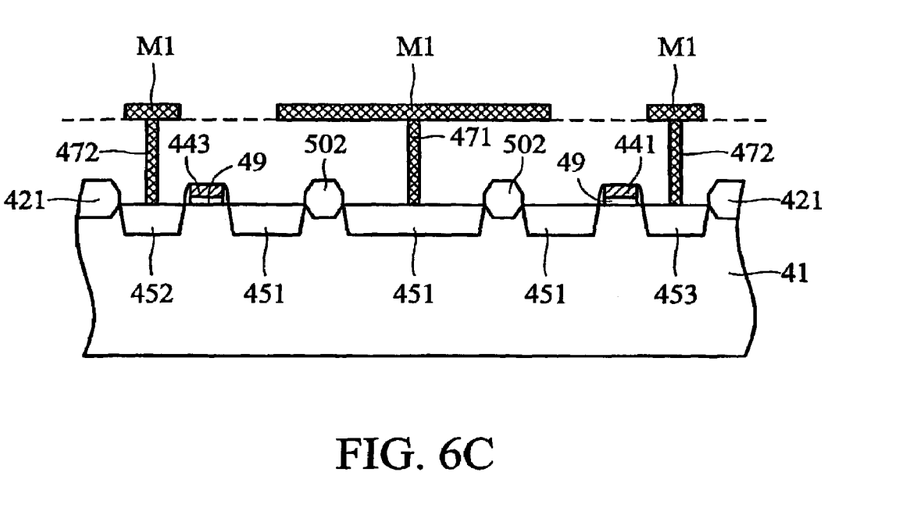

FIGS. 6A, 6B and 6C are diagrams showing an ESD protection device according to a third embodiment of the invention. FIGS. 6B and 6C show cross sections of FIG. 6A along line DD' and EE' respectively. The ESD protection devices shown in FIGS. 5A~5C and 6A~6C are similar except that the islands 50 are formed by field oxide layers 502 in FIGS. 6A~6C. The islands 50 are preferably formed by the same construction as the surrounding isolation region 421 for the transistor. The isolation region 421 may be formed by STI or LOCOS process.

Figure 7A:
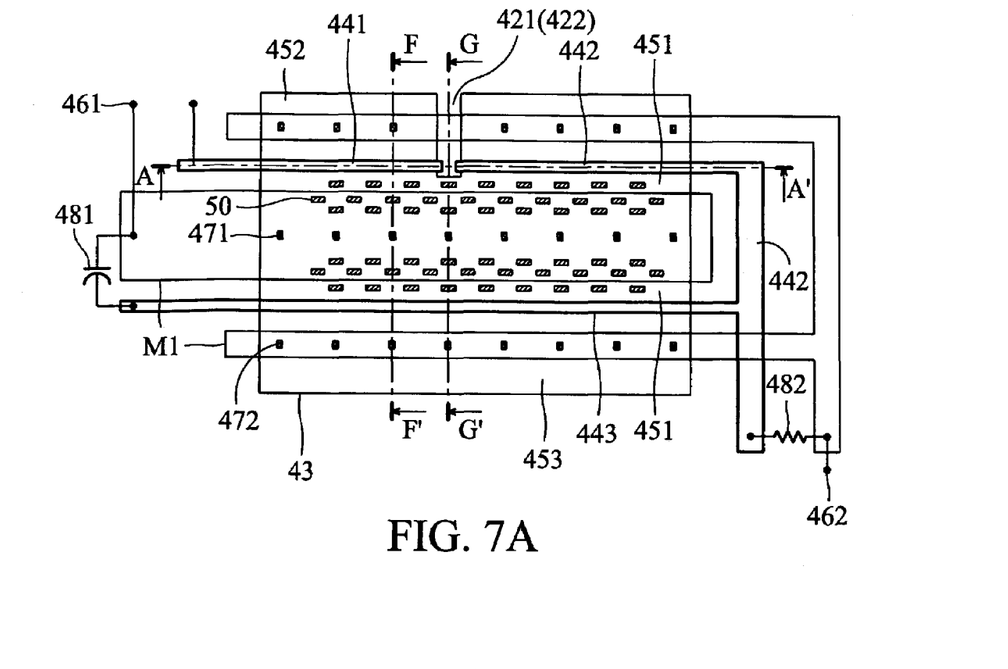
FIGS. 7A, 7B and 7C are diagrams showing an ESD protection device according to a fourth embodiment of the invention.
Figure 7B:
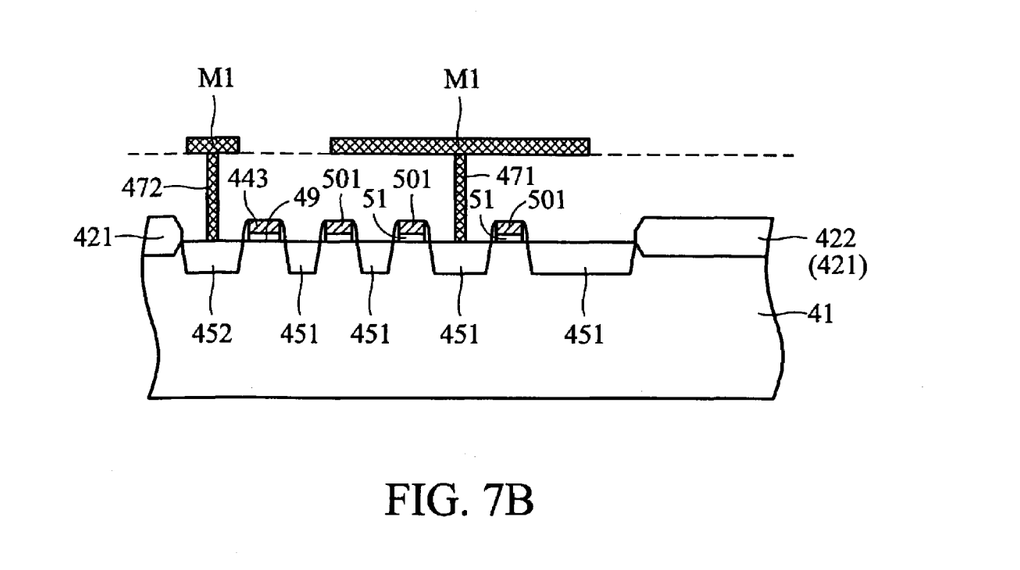
Figure 7C:
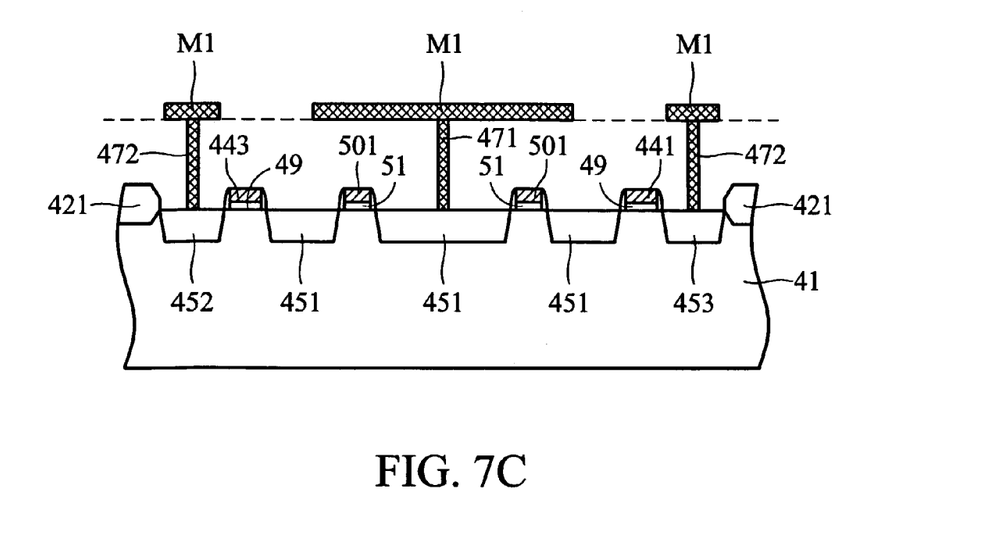

FIGS. 7A, 7B and 7C are diagrams showing an ESD protection device according to a fourth embodiment of the invention. FIGS. 7B and 7C show cross sections of FIG. 7A along line GG' and FF' respectively. The ESD protection devices shown in FIGS. 7A~7C and 5A~5C are similar except for isolation region 422. For clarity, no reiteration is made to the same elements in FIGS. 7A~7C and FIGS. 5A~5C.

The isolation region 422 is an extension of the isolation 421 into the active region 43. The isolation region 422 forms a peninsula structure extending from the isolation region 421 and partially surrounded by the active region 43.

Figure 8A:
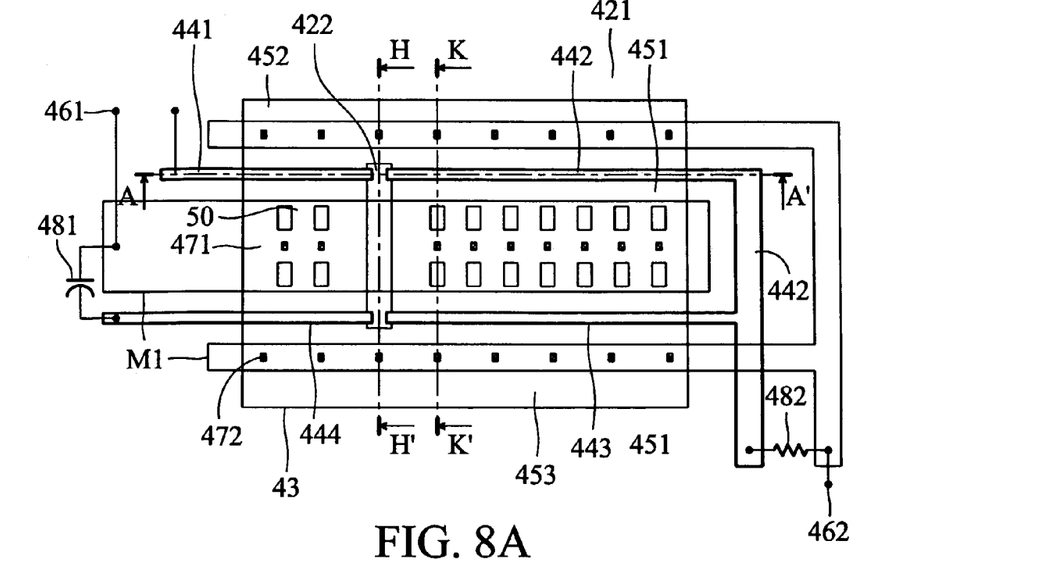
FIGS. 8A; 8B and 8C are diagrams showing an ESD protection device according to a fifth embodiment of the invention.
Figure 8B:
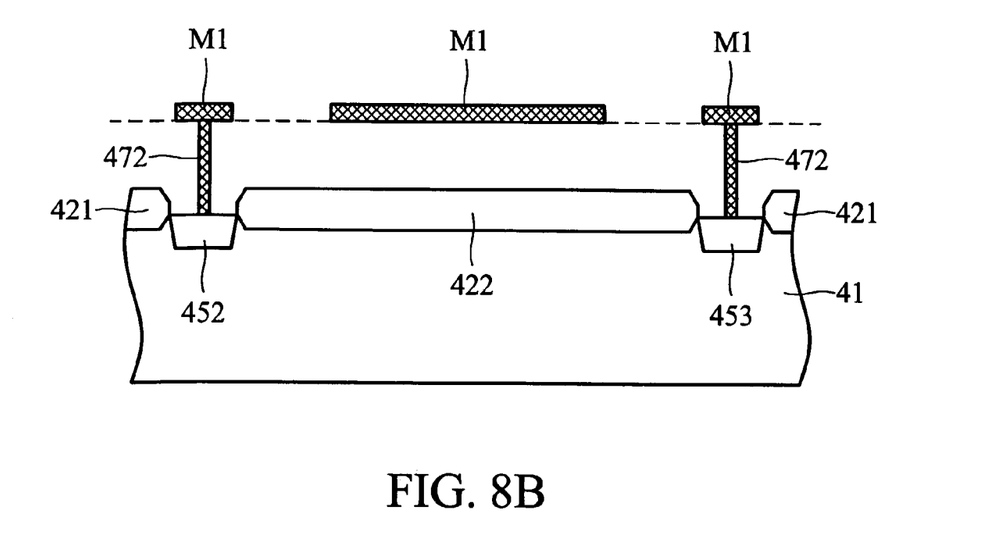
Figure 8C:
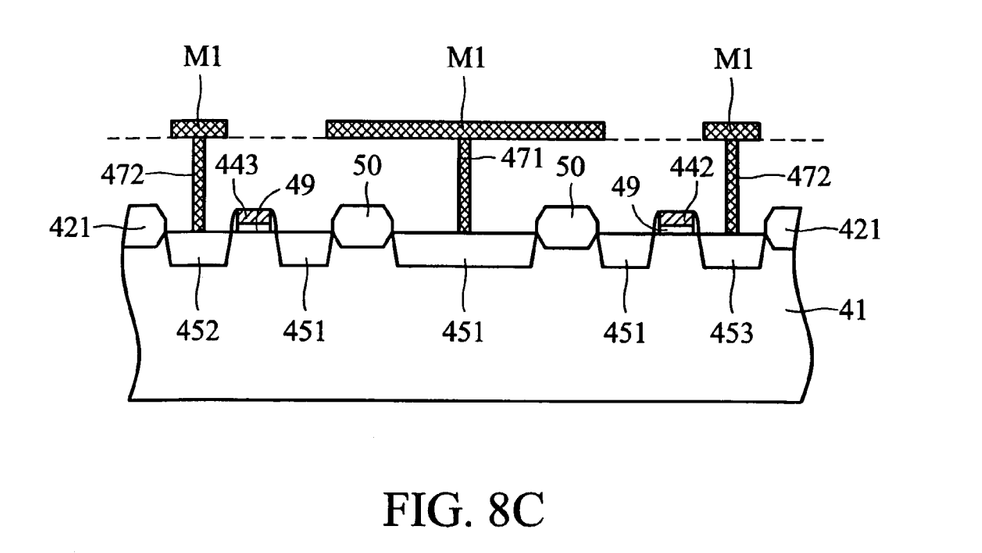

FIGS. 8A, 8B and 8C are diagrams showing an ESD protection device according to a fifth embodiment of the invention. FIGS. 8B and 8C show cross sections of FIG. 8A along line HH' and KK' respectively. The ESD protection devices shown in FIGS. 6A~6C and 8A~8C are similar except for isolation region 422 and a gate 444 in the active area 43. For clarity, no reiteration is made to the same elements in FIGS. 8A~8C and FIGS. 6A~6C.

The gate 444 is formed in the active region 43. The gate 443 has two ends respectively extending over (overlapping) the isolation regions 421 and 422. The gate 44 also has two ends respectively extending over (overlapping) the isolation regions 421 and 422. The gates 441 and 442 are substantially collinear and the gates 443 and 444 are substantially collinear. The gate 441 is coupled to the gate 443 and the gate 442 is coupled to the gate 444. Some of the drain contacts 471 are disposed between the gates 441 and 443, and the others are between the gates 442 and 444. The island array comprises a group of distributed islands 50 and the isolation region 422 extends into the group of distributed islands 50.

Figure 9:
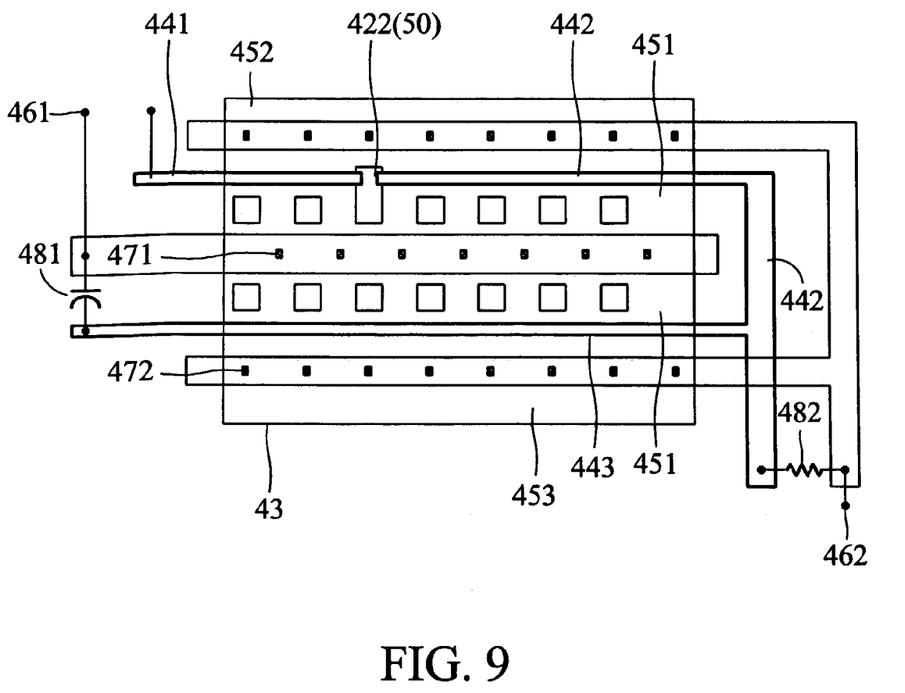
FIG. 9 is a diagram showing an ESD protection device according to a sixth embodiment of the invention.

FIG. 9 is a diagram showing an ESD protection device according to a sixth embodiment of the invention. The ESD protection devices shown in FIGS. 6A~6C and 9 are similar except that the isolation region 422 extends into the island array.

In conclusion, the present invention provides an improved MOSFET-based ESD protection device. An isolation region is formed in the active region, and collinear gates separated by the isolation region are also formed in the active region. This achieves an equivalent long gate finger enabling the cascading effect whereby the drawbacks in the conventional ESD protection device are eliminated.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An electrostatic discharge protection device formed on a substrate, comprising:
a first isolation region formed over the substrate;
an active region formed over the substrate and enclosed by the first isolation region;
a second isolation region formed on the substrate and substantially surrounded by the active region;
a first gate element formed in the active region, having a first end overlapping a first edge of the first isolation region and a second end overlapping a second edge of the second isolation region;
a drain region formed in the active region at a first side of the first gate element;
a source region formed in the active region at a second side of the first gate element a drain contact for electrically coupling the drain region to a first node; and
a source contact for electrically coupling the source region to a second node;
wherein the second isolation region forms a peninsula structure extending from the first isolation region and is partially surrounded by the active region.

2. The electrostatic discharge protection device as claimed in claim 1, wherein the second isolation region is completely surrounded by the active region.

3. The electrostatic discharge protection device as claimed in claim 1 further comprising a second gate element formed in the active region, having a third end extending over the first isolation region and a fourth end extending over the second isolation region.

4. The electrostatic discharge protection device as claimed in claim 3, wherein the first end and the second end of the first gate element and the third end and the fourth end of the second gate element are substantially collinear.

5. The electrostatic discharge protection device as claimed in claim 3, wherein the first and the second gate elements are each formed by a poly-silicon layer over a an oxide layer simultaneously.

6. The electrostatic discharge protection device as claimed in claim 3 further comprising a third gate element tuned in the active region, the third gate element having fifth and a sixth ends, each extending over the first isolation region; and the drain contact located between the first and the third gate elements.

7. The electrostatic discharge protection device as claimed in claim 6, wherein the third gate element separates the drain region and another source region within the active region.

8. The electrostatic discharge protection device as claimed in claim 6, wherein the third gate element electrically connects to the first gate element.

9. The electrostatic discharge protection device as claimed in claim 6, wherein the third gate element electrically connects to the second gate element.

10. The electrostatic discharge protection device as claimed in claim 3, wherein the first gate element couples to a gate-input signal and the second gate element couples to the second node.

11. The electrostatic discharge protection device as claimed in claim 9, wherein the second gate element couples to the second node through a first impedance.

12. The electrostatic discharge protection device as claimed in claim 11, wherein the first impedance is a resistive element.

13. The electrostatic discharge protection device as claimed in claim 9, wherein the second gate element further couples to the first node through a second impedance.

14. The electrostatic discharge protection device as claimed in claim 13, wherein the second impedance is a capacitive element.

15. The electrostatic discharge protection device as claimed in claim 1, wherein the first node is an IC pad.

16. The electrostatic discharge protection device as claimed in claim 1, wherein the second node is a power bus.

17. The electrostatic discharge protection device as claimed in claim 1, wherein the source and the drain regions are n-type, and the second node is a VSS power bus.

18. The electrostatic discharge protection device as claimed in claim 1, wherein the source and the drain regions are p-type, and the second node is a VDD power bus.

19. The electrostatic discharge protection device as claimed in claim 1, further comprising an stray of at least one island distributed in the drain region between the drain contact and at least one of the first gate element and the second isolation region.

20. The electrostatic discharge protection device as claimed in claim 3 further comprising an array of at least one island distributed in the drain region between the drain contact and at least one of the first gate element, the second gate element and the second isolation region.

21. The electrostatic discharge protection device as claimed in claim 20, wherein the drain contact is an array of drain contacts, the first gate element, the second gate element and the second isolation region form a first group; and the array of at least one island comprises a row of islands disposed between the array of drain contacts and the first group.

22. The electrostatic discharge protection device as claimed in claim 19, wherein the array of at least one island comprises multiple rows of islands.

23. The electrostatic discharge protection device as claimed in claim 19, wherein the array of at least one island comprises a first island comprising a poly-silicon element over an oxide layer.

24. The electrostatic discharge protection device as claimed in claim 19, wherein the array of at least one island comprises a first island comprising a field-oxide layer.

25. The electrostatic discharge protection device as claimed in claim 19, wherein the array of at least one island comprises a first island formed by the seine process as the first isolation region.

26. The electrostatic discharge protection device as claimed in claim 1, wherein the second isolation region forms a peninsula structure extending from the first isolation region and is partially surrounded by the active region.

27. The electrostatic discharge protection device as claimed in claim 3 further comprising third and fourth gate elements formed in the active region, the third gate element having fifth and sixth ends extending over the first and the second isolation regions, and the fourth gate element having seventh and eight ends extending over the first and the second isolation regions.

28. The electrostatic discharge protection device as claimed in claim 27, wherein the first gate element connects to the third gate element and the second gate element connects to the fourth gate element.

29. The electrostatic discharge protection device as claimed in claim 27, wherein the drain contact is disposed between the first and the third gate elements; and another drain contact is disposed between the second and fourth gate elements.

30. The electrostatic discharge protection device as claimed in claim 27, wherein the first and second gate elements are substantially collinear, and the third and fourth gate elements are substantially collinear.

31. The electrostatic discharge protection device as claimed in claim 19, wherein the array of at least one island comprises a group of distributed islands; and the second isolation region extends into the group of distributed islands.

32. An electrostatic discharge protection device Conned on a substrate, comprising:
a first isolation region formed over the substrate;
an active region farmed over the substrate and enclosed by the first isolation region;
a second isolation region formed on the substrate and substantially surrounded by the active region;
a lint gate element coupled to an IC pad and formed in the active region having a first and a second ends extending over the first and the second isolation regions;
a second gate element coupled to a power bus and formed in the active region having a third and a fourth ends extending over to first and the second isolation regions; and
a third gate element formed in the active region having a fifth and a sixth ends, each extending over the first isolation region;
wherein the first and the second gate elements are substantially collinear.

33. The electrostatic discharge protection device as claimed in claim 32, wherein the third gate element is substantially parallel to the first and the second gate elements.

34. The electrostatic discharge protection device as claimed in claim 32, wherein the substrate is of a first type, further comprising:
a first heavily doped region of a second type formed in the active region at a first side of the first gate element;
a second heavily doped region of the second type formed in the active region at a second side of the first gate element;
a first contact for electrically coupling the first heavily doped region to a first node; and
a second contact for electrically coupling the second heavily doped region to a second node.

35. The electrostatic discharge protection device as claimed in claim 34, wherein the first contact comprises a row of contacts substantially parallel to at least one of the first, the second and the third gate element.

36. The electrostatic discharge protection device as claimed in claim 35, wherein the first contact comprises a row of contacts parallel to the first, the second and the third gate element.

37. The electrostatic discharge protection device as claimed in claim 35, wherein the row of the contacts is disposed between the first and the third gate elements.

38. The electrostatic discharge protection device as claimed in claim 37, wherein the row of the contacts is further between the second and the third gate elements.

39. The electrostatic discharge protection device as claimed in claim 32, wherein the third gate element couples to one of the first and the second nodes.

40. The electrostatic discharge protection device as claimed in claim 34 further comprising at least one island disposed in the active region and being surrounded by the first heavily doped region.

41. The electrostatic discharge protection device as claimed in claim 40, wherein the at least one island comprises a first island; and the first island further comprises a field oxide layer.

42. The electrostatic discharge protection device as claimed in claim 40, wherein the at least one island comprises a first island formed by the same process as the first isolation region.

43. The electrostatic discharge protection device as claimed in claim 40, wherein the at least one island including a first island further comprises a poly-silicon layer over an oxide layer.

44. The electrostatic discharge protection device as claimed in claim 40, wherein the at least one island comprises a first island formed by the same process as the first gate element.

45. The electrostatic discharge protection device as claimed in claim 40, wherein the at least one island comprises a first island formed simultaneously with either the first isolation region or the first gate element.

46. The electrostatic discharge protection device as claimed in claim 40, wherein the first contact is a first array of contacts, and the at least one island comprises a first plurality of islands disposed between the first array of contacts and the first and second gate elements.

47. The electrostatic discharge protection device as claimed in claim 46, wherein the at least one island thither comprises a second plurality of islands disposed between the first array of contacts and the third gate elements.

48. The electrostatic discharge protection device as claimed in claim 34, wherein the first heavily doped region is at a first side of the third gate element, further comprising a third heavily doped region of a second type formed in the active region at a second side of the third gate element; and a third contact for electrically coupling the third heavily doped region to the second node.

* * * * *